US006693282B1

United States Patent
Tiemeijer

(10) Patent No.: US 6,693,282 B1
(45) Date of Patent: Feb. 17, 2004

(54) PARTICLE-OPTICAL APPARATUS INCLUDING A PARTICLE SOURCE THAT CAN BE SWITCHED BETWEEN HIGH BRIGHTNESS AND LARGE BEAM CURRENT

(75) Inventor: Peter Christiaan Tiemeijer, Eindhoven (NL)

(73) Assignee: FEI Company, Hillsboro, OR (US)

( * ) Notice: Subject to any disclaimer, the term of this patent is extended or adjusted under 35 U.S.C. 154(b) by 107 days.

(21) Appl. No.: 09/596,217

(22) Filed: Jun. 19, 2000

(30) Foreign Application Priority Data

Jun. 22, 1999 (EP) .............................. 99201995

(51) Int. Cl.$^7$ ............................................... H01J 37/73
(52) U.S. Cl. ........................... 250/396 R; 250/396 ML; 250/491.1; 250/492.1; 250/492.2; 250/493.1; 250/423; 250/398; 250/310; 250/311
(58) Field of Search ................................ 250/310, 311, 250/307, 491.1, 492.1, 398, 396 R, 396 ML, 492.2, 493.1

(56) References Cited

U.S. PATENT DOCUMENTS

| 3,842,271 | A | * | 10/1974 | Gee et al. ..................... 250/310 |
| 4,460,831 | A | * | 7/1984 | Oettinger et al. ......... 250/492.2 |
| 4,990,778 | A | * | 2/1991 | Norioka ....................... 250/310 |
| 5,142,148 | A | * | 8/1992 | Sato ............................ 250/310 |
| 5,149,967 | A | * | 9/1992 | Otaka .......................... 250/310 |
| 5,196,707 | A | * | 3/1993 | Gesley ................. 250/396 ML |
| 5,254,856 | A | * | 10/1993 | Matsui et al. ................ 250/310 |
| 5,389,787 | A | * | 2/1995 | Todoroko et al. ............ 250/310 |
| 5,424,541 | A | * | 6/1995 | Todoroko et al. ............ 250/310 |
| 5,442,183 | A | * | 8/1995 | Matsui et al. ........... 250/441.11 |
| 5,502,306 | A | * | 3/1996 | Meisberger et al. ......... 250/310 |
| 5,633,507 | A | * | 5/1997 | Pfeiffer et al. .......... 250/492.23 |
| 5,661,307 | A | * | 8/1997 | Tanaka et al. ............ 250/492.2 |
| 5,981,962 | A | * | 11/1999 | Groves et al. .......... 250/492.23 |
| 6,011,269 | A | * | 1/2000 | Veneklasen et al. .... 250/492.23 |
| 6,333,508 | B1 | * | 12/2001 | Katsap et al. ............. 250/492.2 |
| 6,400,090 | B2 | * | 6/2002 | Katsap et al. ............ 315/111.81 |
| 6,492,647 | B1 | * | 12/2002 | Katsap et al. ............. 250/492.2 |

FOREIGN PATENT DOCUMENTS

EP 0502401 B1 9/1992 .......... H01J/37/073

* cited by examiner

Primary Examiner—John R. Lee
Assistant Examiner—David A. Vanore
(74) Attorney, Agent, or Firm—Michael O. Scheinberg

(57) ABSTRACT

An electron source for, for example, an electron microscope cannot exhibit a high brightness and a large beam current at the same time, because the virtual emitter dimension is enlarged by Coulomb repulsion in the electron beam in the case of a large beam current, thus reducing the brightness. In a conventional electron source switching-over could take place from a high brightness to a large beam current by varying the dimension of a beam-limiting diaphragm; however, this is objectionable because the location of such a diaphragm is not readily accessible. In accordance with the invention said switching-over can take place by arranging two lenses 26, 28 in the source, which lenses parallelize In the described circumstances the beam either directly behind the emitter 4 (large current) or directly in front of the diaphragm aperture 32 (high brightness).

18 Claims, 2 Drawing Sheets

PARTICLE-OPTICAL APPARATUS INCLUDING A PARTICLE SOURCE THAT CAN BE SWITCHED BETWEEN HIGH BRIGHTNESS AND LARGE BEAM CURRENT

FIELD OF THE INVENTION

The invention relates to a particle-optical apparatus which includes a source assembly for producing a beam of accelerated, electrically charged particles, which source assembly includes successively a particle emitter, a particle lens and an anode and also includes a beam-limiting diaphragm.

DESCRIPTION OF THE PRIOR ART

A source assembly of the kind set forth is known from European patent No. 0 502 401, notably from the FIGS. 2 and 3a and the associated description. Particle sources of this kind are customarily used in electron microscopes or apparatus for the manufacture of integrated circuits by means of electron beams or ion beams, i.e. so-called lithography apparatus. The source assembly disclosed in the cited European patent is arranged to produce an electron beam which emanates from the particle emitter and is accelerated by the anode voltage. The particle emitter in the known source assembly is formed by the combination of an electron-emissive surface and a directly subsequent extractor electrode. The extractor electrode may be provided with a beam-limiting diaphragm for defining the angle of aperture of the electron beam produced. The beam-limiting diaphragm transmits only a minority of the electrons emitted by the particle emitter.

Downstream from the particle emitter there is arranged an electrode for focusing the electron beam. Said beam-limiting diaphragm may alternatively be provided in said focusing electrode. The electrostatic field generated by said focusing electrode in cooperation with the extractor electrode thus constitutes a particle lens forming part of the source assembly. Finally, the anode accelerates electron beam produced by the particle to the acceleration voltage required for the relevant application of the particle optical apparatus.

Because of the fixed arrangement of the particle lens relative to the other elements of the source assembly and because of the location and the dimensions of the beam-limiting diaphragm, the beam current and brightness produced by the source assembly are either fixed (for a given electron current produced by the particle emitter) or can hardly be varied for all practical purposes. It is to be noted that in the context of the present invention the term "brightness" is to be understood to mean the beam current which is emitted per unit of solid angular measure and per unit of emissive surface area. Generally speaking, it is not possible to realize a large beam current and a high brightness of the electron beam at the same time. This is due to the so-called Coulomb interaction (repulsion) between the electrons of the beam which increases the apparent dimensions of the emissive surface in the case of a large current, and hence reduces the brightness. However, it is sometimes desirable to have either a large beam current or a high brightness of the particle beam, depending on the relevant application of the particle-optical apparatus. It could be attempted to realize such a selection possibility by installing a beam-limiting diaphragm of different dimensions or by arranging this diaphragm in a different location in the source assembly. However, this approach has considerable drawbacks as will be described hereinafter.

Arranging the beam-limiting diaphragm in front of the anode, i.e. in front of the accelerating high-voltage field, has a number of drawbacks. A first drawback is due to the fact that the anode in a particle-optical apparatus, such as an electron microscope, carries ground potential so that the electron source carries the negative acceleration high voltage which may be of the order of magnitude of −300 kV. Consequently, the diaphragm (since it is situated in or in front of the accelerating field) also carries approximately this high voltage, so that the manipulability of this diaphragm is significantly impeded and practically non-existent in practice.

A second drawback is due to the fact that many electron microscopes are provided with a high-voltage insulating envelope which surrounds the space in which the electron source is situated and contains an insulating gas such as sulphur fluoride ($SF_6$). The accessibility of the diaphragm is thus strongly reduced. The formation of passages, either mechanical or electrical, through this gas-filled space gives rise to problems as regards gastightness and also as regards electrical insulation of the passages. (The existing electrical connections to the source assembly are fed in via a high-voltage cable of standard design which has been taken into account for the design of the microscope. However, this standard cable is not suitable to conduct electrical signals other than those for which it has been designed).

A third drawback is due to the fact that it would be necessary to make holes for passages in the microscope column of an electron microscope which may already have been installed at a customer. This would necessitate complete disassembly, involving contamination of the vacuum space of the microscope, and also transport of heavy precision tools.

In the described circumstances notably the alignment of the various components of the source assembly relative to one another and relative to the remainder of the electron microscope will be seriously hampered by the above problems.

SUMMARY OF THE INVENTION

It is an object of the invention to provide a particle source of the kind set forth in which switching over between a large beam current and a high brightness of the particle beam can take place in operational conditions, without mechanical modifications of the source assembly being required.

To this end, the particle-optical apparatus according to the invention is characterized in that the source assembly is provided with at least one further particle lens which is arranged between the first-mentioned particle lens and the anode, the beam-limiting diaphragm is arranged at the area of or downstream from the further particle lens, and the apparatus is provided with energizing means for the mutually independent energizing of the first-mentioned lens and the further particle lens.

It is now possible to energize the first particle lens (i.e. the lens situated nearest to the particle emitter) and not the further particle lens. The particle beam emanating from the emissive surface is then already parallelized more or less immediately upon leaving said surface, so that this parallel beam has a comparatively small cross-section so that a comparatively large number of particles will traverse the beam-limiting diaphragm which is arranged at that area or downstream from the further particle lens (i.e. directly in front of, in or behind said further lens). Thus, a comparatively large beam current is obtained in this situation.

However, it may also be elected to energize the further particle lens (situated comparatively far from the particle emitter) and to abstain from energizing the first particle lens. The particle beam emanating from the emissive surface is then more or less parallelized comparatively far from said surface, so that this parallel beam has a comparatively large cross-section and hence comparatively few particles will traverse the beam-limiting diaphragm. In this situation, therefore, a comparatively high brightness is obtained in conjunction with a smaller beam current, because only little current is left behind the diaphragm, so that no or hardly any Coulomb repulsion occurs and hence the virtual emissive surface area will not be enlarged.

The further particle lens in an embodiment of the invention is constructed as an electrostatic lens. The compact construction of such lenses makes this embodiment particularly suitable for building into the source assembly according to the invention.

The particle emitter in another embodiment of the invention is constructed as a field emission particle emitter, an extraction electrode being arranged between the particle emitter and the first-mentioned particle lens which consists of a combination of the extraction electrode and a second electrode. The idea of the invention becomes particularly manifest in this embodiment, because a very small apparent dimension of the emissive surface can be achieved by means of a field emission particle emitter, corresponding to a high brightness. Using such a source, therefore, switching over is possible between a source of high brightness and a source of comparatively large current. The extraction electrode of the field emission source can then be used as a part of the first mentioned particle lens, thus realizing the desired very compact construction of such a lens.

The further particle lens in a further embodiment of the invention consists of a combination of the second electrode and a third electrode. In this embodiment the second electrode is used as a part of the further particle lens, so that an even more compact construction of the source assembly is achieved.

In another embodiment of the invention a third particle lens is arranged downstream from the beam-limiting diaphragm and upstream from the anode. This embodiment is suitable for use in those cases where an even larger beam current is required. In that case the first mentioned, i.e. the first, particle lens is energized in such a manner that the electron beam is focused in the aperture of the beam-limiting diaphragm, so that no part of the current emitted by the emissive surface is intercepted by the diaphragm. In order to more or less parallelize the beam emanating from the diaphragm aperture again, the third particle lens with an energizing feature which is suitable for parallelizing is arranged downstream from the diaphragm aperture.

The further particle lens in another embodiment yet of the invention is provided with the beam-limiting diaphragm which has a diaphragm aperture of a diameter of no more than 0.5 mm. Computer simulations have shown that for this dimension of the diaphragm aperture in most cases Coulomb interaction no longer occurs in the operating mode involving the high brightness.

The diameter of the diaphragm aperture amounts to no more than 0.2 mm in a further embodiment of the invention. Computer simulations have shown that in those exceptional cases where the dimension of 0.5 mm of the diaphragm aperture would still produce Coulomb interaction in the operating mode involving the high brightness, said dimension of 0.2 mm suffices to prevent such interactions.

The invention will be described in detail hereinafter with reference to the Figures. Therein:

DETAILED DESCRIPTION OF THE PREFERRED EMBODIMENTS

Figure 1:
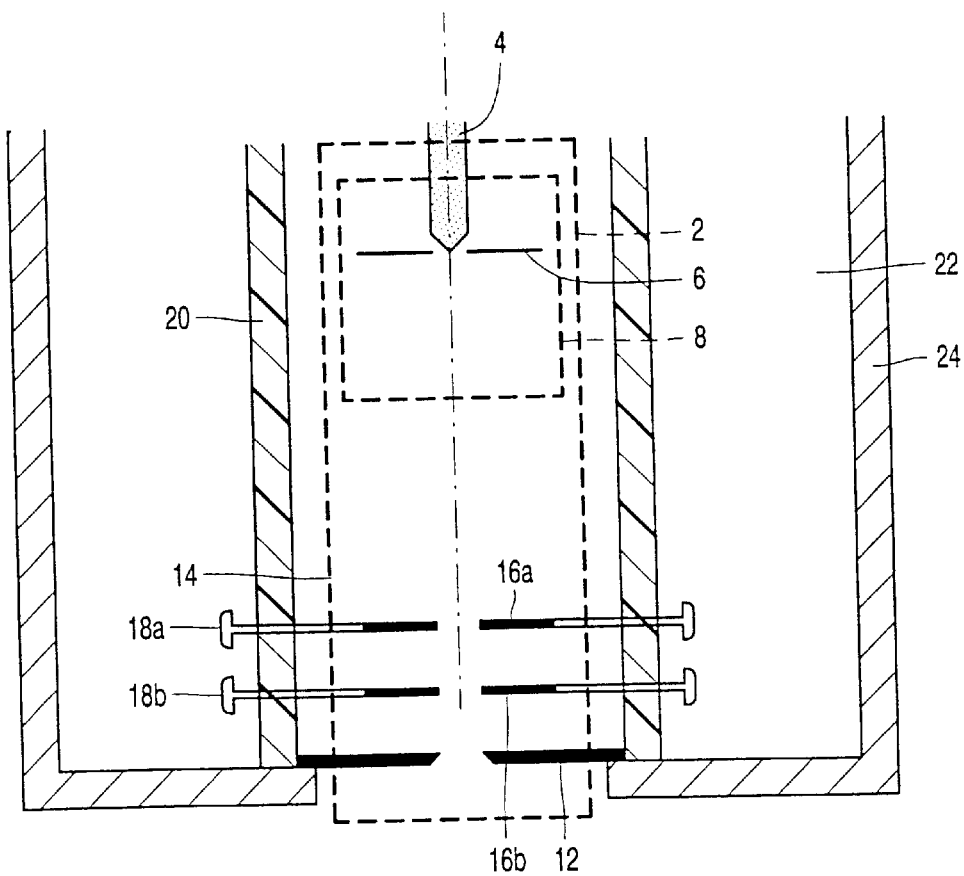
FIG. 1 is a diagrammatic sectional view taken in a plane through the optical axis of the parts of relevance of an electron microscope which includes the source assembly in accordance with the invention.

FIG. 1 is a diagrammatic sectional view taken in a plane through the optical axis of the parts of relevance of a particle-optical apparatus, notably an electron microscope, which includes the source assembly in accordance with the invention. The electron microscope is provided with a source assembly 2 which is to be referred to hereinafter as a particle source and is notably an electron source for producing a beam of accelerated electrons which is not shown in this Figure. The electron source 2 of the present embodiment is constructed as a field emission source which is provided with an emissive surface in the form of an emissive tip 4, an extraction electrode 6 and further lens-effect electrodes which are not shown in FIG. 1 but will be described with reference to the FIGS. 2 and 3. The lens-effect electrodes are accommodated, together with the tip 4 and the extraction electrode 6, in a lens-effect part 8 of the electron source 2.

The electron source 2 also includes high-voltage means for establishing an accelerating high-voltage field to be traversed by the particles in the electron source. The high-voltage means include a high-voltage generator (not shown in the Figure) which can supply the tip and said electrodes with a high voltage of the order of magnitude of −300 kV with respect to ground potential during operation of the electron microscope. The extraction electrode then carries a voltage of the order of magnitude of a few kV, for example 5 kV, with respect to the tip 4.

The electrons ultimately emanate from the electron source via an aperture in the anode 12 which carries ground potential. The electrons have then been subjected to an accelerating potential difference of approximately 300 kV, corresponding to an accelerating electrostatic high-voltage field present between the tip 4 and the anode 12 in the gun space 14. In order to distribute said field uniformly across the space 14 in the vertical direction, a number of (for example, 8) disc-shaped electrodes is arranged in this space, two of such electrodes (16a and 16b) being shown. The electrodes 16a and 16b are connected to a high voltage which lies between said −300 kV and ground potential and whose value uniformly increases as a function of the distance from the tip. The space 14 is enclosed by a wall 20 of an insulating material such as aluminum oxide ($Al_2O_3$).

For the supply of the high voltage to the disc-shaped electrodes 16a and 16b they are provided with high-voltage terminals 18a and 18b. These high-voltage terminals are connected to the electrodes 16a and 16b through the wall 20; they are situated in a space 22 which is filled with gaseous sulphur fluoride ($SF_6$) for the purpose of high-voltage insulation. The space 22 itself is enclosed by a gastight wall 24.

Figure 2A:
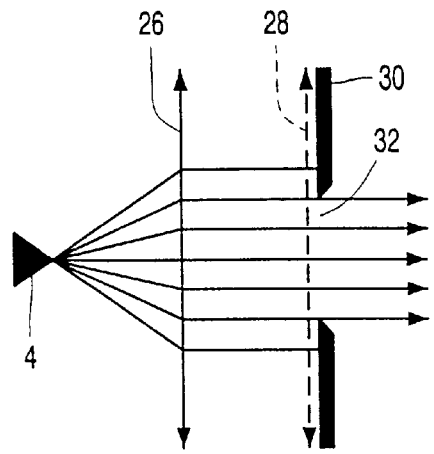
FIG. 2a shows diagrammatically the lens-effect part of the source assembly according to the invention in the case of a comparatively large beam current.
Figure 2B:
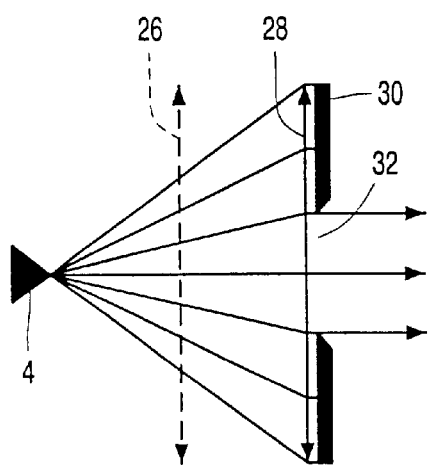
FIG. 2b shows diagrammatically the lens-effect part of the source assembly according to the invention in the case of a comparatively high brightness.

The FIGS. 2a and 2b diagrammatically show the lens-effect part 8 of the electron source 2; FIG. 2a relates to a comparatively large beam current whereas FIG. 2b relates to a comparatively high brightness. The combination of the emissive tip 4 and the extraction electrode 6 is denoted by the reference numeral 4 in both Figures. This embodiment is provided with a first electrostatic lens 26 and a second electrostatic lens 28. Directly subsequent to the second lens 28 there is arranged a beam-limiting diaphragm 30 with a diaphragm aperture 32.

FIG. 2a shows the lens 26 in the energized state and the lens 28 in the de-activated state. Because the lens 26 is situated near the emissive surface 4, the electrons in the divergent part of the beam between the surface 4 and the lens 26 have moved only a small distance away from the optical axis (extending through the center of the tip 4 and the center of the diaphragm aperture 32). Consequently, the major part of these electrons will be present in the parallel part of the beam subsequent to the diaphragm aperture 32, so that the parallel beam exhibits a large beam current. As has already been described, Coulomb repulsion then degrades the brightness, so that the situation shown in FIG. 2a represents the operating mode with a comparatively large beam current and a comparatively low brightness.

In FIG. 2b the lens 26 is de-activated and the lens 28 is energized. Because the lens 28 is situated comparatively far from the emissive surface 4, the electrons in the divergent part of the beam between the surface 4 and the lens 28 can travel comparatively far from the optical axis. Consequently, only a comparatively small part of these electrons will be present in the parallel part of the beam subsequent to the diaphragm aperture 32, so that the parallel beam exhibits a comparatively small beam current. As has already been described, the Coulomb repulsion is thus completely or mainly avoided, so that the brightness of the electron source is not degraded; therefore, the situation shown in FIG. 2b represents the mode of operation involving a comparatively small beam current and a comparatively high brightness.

Figure 3:
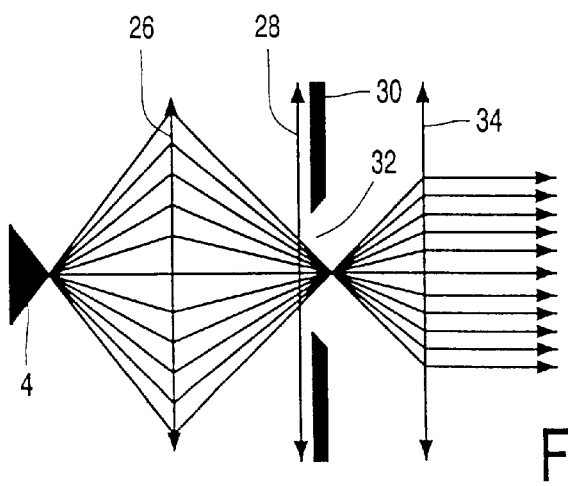
FIG. 3 shows diagrammatically the lens-effect part of the source assembly according to the invention which includes a third particle lens.

FIG. 3 shows diagrammatically the lens-effect part 8 of the electron source 2 with a third particle lens. This configuration is important notably for situations in which an as large as possible beam current is desired. Therefore, FIG. 3 shows only the mode of operation involving a large beam current and a comparatively low brightness. Like in FIG. 2, the combination of the emissive tip 4 and the extraction electrode 6 is again represented by the reference numeral 4; this embodiment includes the first electrostatic lens 26 and the second electrostatic lens 28. Furthermore, the beam-limiting diaphragm 30 with the diaphragm aperture 32 is arranged directly subsequent to the second lens 28. A third electrostatic lens 34 is arranged downstream from the beam-limiting diaphragm 30 in this Figure.

In this embodiment the first lens 26 is energized to a greater extent than in FIG. 2a, so that the initially divergent electron beam becomes a convergent beam with a cross-over in the diaphragm aperture 32 of the beam-limiting diaphragm 30. If necessary, the lens 28 may also be energized so that this lens can also contribute to the converging of the beam. Because the cross-over is situated in the diaphragm aperture, all electrons in the beam will pass through this aperture and hence no electrons will be lost from the beam, so that FIG. 3 represents the mode of operation with a maximum beam current. The third lens 34 is then also energized, so that the strongly divergent beam subsequent to the diaphragm aperture can be parallelized again by this lens. FIG. 3 thus represents the mode of operation involving a maximum beam current and a comparatively low brightness.

What is claimed is:

1. A source assembly, comprising:
   a particle emitter operable to generate a beam of electrically charged particles;
   an electrostatic field assembly including an anode downstream from said particle emitter, said electrostatic field assembly operable to establish a potential difference between said particle emitter and said anode; and
   a lens effect assembly for focusing the beam of electrically charged particles generated by said particle emitter, said lens effect assembly including a first particle lens arranged between said particle emitter and said anode, said first particle lens operable to be independently energized to focus the beam of electrically charged particles, a second particle lens arranged between said first particle lens and said anode, said second particle lens operable to be independently energized to focus the beam of electrically charged particles, and a diaphragm arranged between said second particle lens and said anode for emitting at least a portion of the beam of electrically charged particles in a downstream direction of said anode.

2. The source assembly of claim 1, wherein said first particle lens is an electrostatic lens.

3. The source assembly of claim 1, wherein said second particle lens is an electrostatic lens.

4. The source assembly of claim 1, wherein said lens effect assembly further includes:
   a third particle lens arranged between said diaphragm and said anode, said third particle lens operable to be independently energized.

5. The source assembly of claim 4, wherein said third particle lens in electrostatic lens.

6. A particle-optical apparatus comprising:
   a source assembly arranged to produce a beam of accelerated, electrically charged particles, said source assembly including a particle emitter, a first particle lens, and a beam-limiting diaphragm: and
   an anode, wherein the source assembly is provided with at least one further particle lens arranged between the first particle lens and the anode, the beam-limiting diaphragm being arranged at an area downstream from the further particle lens,
   at least one energizing, source for the mutually independent energizing of the first particle lens and the further particle lens.

7. A particle-optical apparatus as claimed in claim 6, wherein the first particle lens is constructed as an electrostatic lens.

8. A particle-optical apparatus as claimed in claim 7, wherein the particle emitter is constructed as a field emission particle emitter, wherein an extraction electrode is arranged between the particle emitter and the first particle lens, which is a combination of the extraction electrode and a second electrode.

9. A particle-optical apparatus as claimed in claim 8, wherein the further particle lens consists of a combination of the second electrode and a third electrode.

10. A particle-optical apparatus as claimed in claim 6, wherein a third particle lens is arranged downstream from the beam-limiting diaphragm and upstream from the anode.

11. A particle-optical apparatus as claimed in claim 6, wherein the beam-limiting diaphragm has a diaphragm aperture of a diameter of no more than 0.5 mm.

12. A particle-optical apparatus as claimed in claim 6, wherein the diameter of the diaphragm aperture amounts to no more than 0.2 mm.

13. A particle beam apparatus, comprising:

a particle emitter operable to generate a beans of electrically charged particles;

a first particle lens operably arranged downstream from said particle emitter;

a second particle lens operably arranged downstream from said first particle lens; and a diaphragm operably arranged downstream from said second particle lens for emitting at least a portion of the charged particle beam in a downstream direction to form a beam spot at a target, wherein the first and second lens are operable to be independently energized to focus (1) a relatively high current, low brightness beam spot when the first lens is active and the second lens is inactive, and (2) a relatively high brightness, low current beam spot when the first lens is inactive and the second lens is active.

14. The apparatus of claim 13, wherein said first particle lens is an electrostatic lens.

15. The apparatus of claim 13, wherein said second particle lens is an electrostatic lens.

16. The apparatus of claim 13, further comprising a third particle lens operably arranged downstream from said beam limiting aperture.

17. The apparatus of claim 16, wherein said third particle lens is simultaneously energizaeble with said first and second lenses to create a relatively high current beam spot.

18. The apparatus of claim 17, wherein the lenses are arranged so that the beam has a convergence crossover substantially proximal to said beam limiting aperture when the first, second, and third lenses are simultaneously active.

* * * * *